US012655031B2

(12) United States Patent
Xu

(10) Patent No.: US 12,655,031 B2
(45) Date of Patent: Jun. 16, 2026

(54) COMPOSITE ELECTRON TRANSPORT MATERIAL AND PREPARATION METHOD THEREFOR, AND LIGHT-EMITTING DIODE

(71) Applicant: TCL TECHNOLOGY GROUP CORPORATION, Huizhou (CN)

(72) Inventor: Wei Xu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 321 days.

(21) Appl. No.: 18/270,716

(22) PCT Filed: Dec. 27, 2021

(86) PCT No.: PCT/CN2021/141799
§ 371 (c)(1),
(2) Date: Jun. 30, 2023

(87) PCT Pub. No.: WO2022/143568
PCT Pub. Date: Jul. 7, 2022

(65) Prior Publication Data
US 2024/0076197 A1     Mar. 7, 2024

(30) Foreign Application Priority Data

Dec. 30, 2020    (CN) .......................... 202011627735.9

(51) Int. Cl.
*C01G 9/02*         (2006.01)
*H10K 85/10*        (2023.01)
         (Continued)
(52) U.S. Cl.
CPC ........... *C01G 9/02* (2013.01); *H10K 85/1135* (2023.02); *H10K 85/115* (2023.02);
         (Continued)

(58) Field of Classification Search
CPC .... C01G 9/02; H10K 85/1135; H10K 85/115; H10K 85/151; H10K 50/16; H10K 71/12;
         (Continued)

(56) References Cited

U.S. PATENT DOCUMENTS 9,455,093 B2 *  9/2016  Leung .................. H01G 9/2059
9,793,505 B2 * 10/2017  Zhou .................... H10K 50/115
         (Continued)

FOREIGN PATENT DOCUMENTS

CN         106229393 A     12/2016
CN         107910449 A      4/2018
         (Continued)

OTHER PUBLICATIONS

International Search Report dated Mar. 30, 2022; International Application No. PCT/CN2021/141799; 4 pages (English).
         (Continued)

*Primary Examiner* — Ermias T Woldegeorgis
(74) *Attorney, Agent, or Firm* — Foley & Lardner LLP

(57)         ABSTRACT

Disclosed are a composite electron transport material and a preparation method therefor, and a light-emitting diode. The composite electron transport material includes a core and at least one shell coating the core. The core is made of an inorganic electron transport material; the shell is made of a material including a metal oxide; and a band gap of the metal oxide is wider than that of the inorganic electron transport material. In the composite electron transport material, by covering modification of the core by the shell, the band gap, the conduction band energy level, and the electrical conductivity of the inorganic electron transport material are improved.

18 Claims, 3 Drawing Sheets

(51) Int. Cl.

| | |
|---|---|
| *B82Y 30/00* | (2011.01) |
| *B82Y 40/00* | (2011.01) |
| *H10K 50/16* | (2023.01) |
| *H10K 71/12* | (2023.01) |
| *H10K 71/40* | (2023.01) |
| *H10K 102/00* | (2023.01) |

(52) U.S. Cl.

CPC ............ *H10K 85/151* (2023.02); *B82Y 30/00* (2013.01); *B82Y 40/00* (2013.01); *C01P 2004/80* (2013.01); *C01P 2004/84* (2013.01); *C01P 2006/40* (2013.01); *H10K 50/16* (2023.02); *H10K 71/12* (2023.02); *H10K 71/40* (2023.02); *H10K 2102/361* (2023.02)

(58) Field of Classification Search

CPC ............. H10K 71/40; H10K 2102/361; H10K 2102/331; H10K 50/115; H10K 85/00; H10K 2102/00; B82Y 30/00; B82Y 40/00; C01P 2004/80; C01P 2004/84; C01P 2006/40

See application file for complete search history.

(56) References Cited

U.S. PATENT DOCUMENTS

| | | | |
|---|---|---|---|
| 11,142,692 B2 * | 10/2021 | Zhang .................. | C09K 11/883 |
| 2018/0216250 A1 | 8/2018 | Jang et al. | |
| 2019/0081262 A1 | 3/2019 | Kim et al. | |

FOREIGN PATENT DOCUMENTS

| | | | | | |
|---|---|---|---|---|---|
| CN | 109243841 | A | | 1/2019 | |
| CN | 109494307 | A | | 3/2019 | |
| CN | 110773172 | A | | 2/2020 | |
| CN | 110838560 | A | | 2/2020 | |
| CN | 110970566 | A | | 4/2020 | |
| CN | 110993362 | A | | 4/2020 | |
| CN | 110993808 | A | | 4/2020 | |
| CN | 110838560 | B | * | 6/2021 | ............. B82Y 40/00 |
| KR | 20050074779 | A | | 7/2005 | |
| KR | 20160033520 | A | | 3/2016 | |
| KR | 20160047022 | A | | 5/2016 | |
| KR | 101638366 | B1 | | 7/2016 | |

OTHER PUBLICATIONS

Written Opinion dated Mar. 30, 2022; International Application No. PCT/CN2021/141799; 3 pages (English).

International Search Report dated Mar. 30, 2022; International Application No. PCT/CN2021/141799; 4 pages.

Written Opinion dated Mar. 30, 2022; International Application No. PCT/CN2021/141799; 4 pages.

Written Opinion dated Mar. 30, 2022; International Application No. PCT/CN2021/141799; 3 pages.

Chinese Office Action Issued in CN Application No. 202011627735.9 dated Mar. 27, 2026 with English Translation (24 Pages).

\* cited by examiner

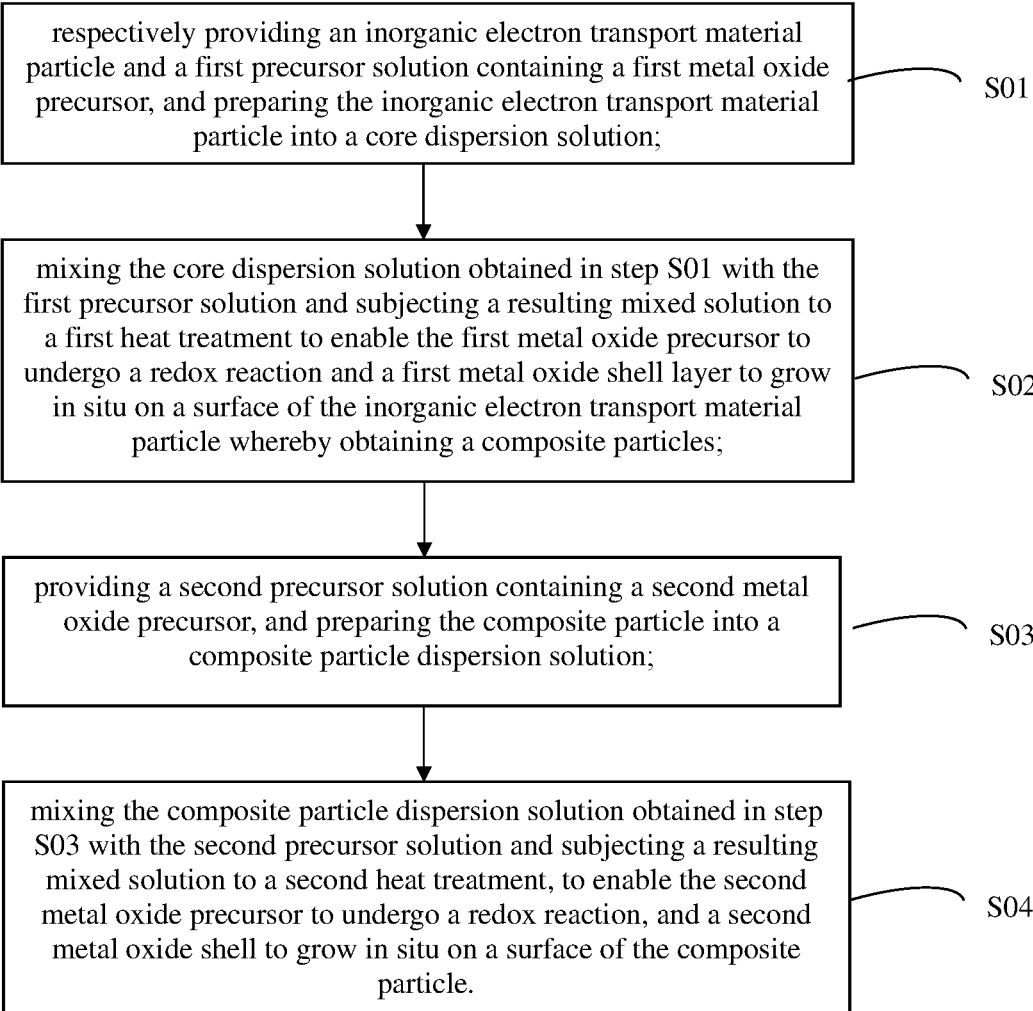

respectively providing an inorganic electron transport material particle and a first precursor solution containing a first metal oxide precursor, and preparing the inorganic electron transport material particle into a core dispersion solution; — S01 mixing the core dispersion solution obtained in step S01 with the first precursor solution and subjecting a resulting mixed solution to a first heat treatment to enable the first metal oxide precursor to undergo a redox reaction and a first metal oxide shell layer to grow in situ on a surface of the inorganic electron transport material particle whereby obtaining a composite particles; — S02 providing a second precursor solution containing a second metal oxide precursor, and preparing the composite particle into a composite particle dispersion solution; — S03 mixing the composite particle dispersion solution obtained in step S03 with the second precursor solution and subjecting a resulting mixed solution to a second heat treatment, to enable the second metal oxide precursor to undergo a redox reaction, and a second metal oxide shell to grow in situ on a surface of the composite particle. — S04

FIG. 3

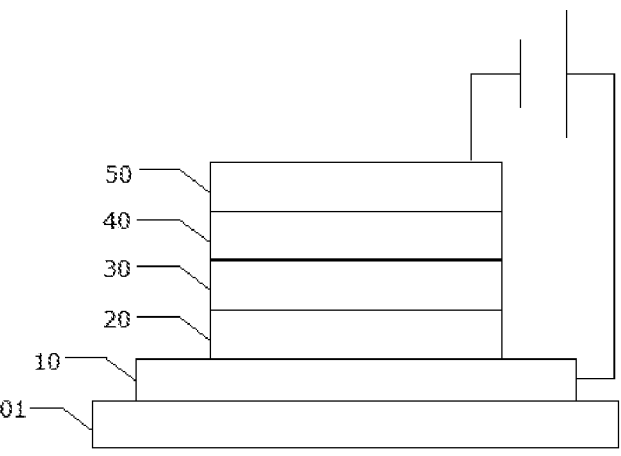

COMPOSITE ELECTRON TRANSPORT MATERIAL AND PREPARATION METHOD THEREFOR, AND LIGHT-EMITTING DIODE

CROSS-REFERENCE TO RELATED APPLICATIONS

The present application is the U.S. national phase of International Application No. PCT/CN2021/141799 with an international filing date of Dec. 27, 2021, designating the U.S., now pending, and claims the priority of the Chinese patent application filed on Dec. 30, 2020 with the application number 202011627735.9 and the application title of "COMPOSITE ELECTRON TRANSPORT MATERIAL AND PREPARATION METHOD THEREFOR, AND LIGHT-EMITTING DIODE". The contents each of which are incorporated herein by reference thereto.

TECHNICAL FIELD

The application relates to the field of optoelectronic technology, and more particularly to a composite electron transport material, a preparation method therefor, and a light-emitting diode.

BACKGROUND

Light-emitting diodes such as quantum dot electroluminescent diodes (QLED) have continuously adjustable light-emitting wavelengths in the visible light range, narrow light-emitting line widths in the range of between 15 nm and 20 nm, high light-emitting color saturation, and light-emitting color gamut up to 90% of the BT2020 standard color gamut. Such advantages have attracted widespread attention. In addition, as the light-emitting materials, quantum dots are inorganic nanocrystals, which, after being prepared into devices, have a long theoretical service life, good device stability, fast response time, low operating voltage, high contrast, and can be made into large-size and flexible display panels, and may become a hottest next-generation display technology.

At present, light-emitting diodes, especially QLEDs, have T50>2,000,000 hrs at 100 cd m$^{-2}$, while blue QLEDs have T50>10,000 hrs at 100 cd m$^{-2}$, and the service life of blue quantum dot devices cannot yet meet the commercialization requirements. The short working service life of blue QLEDs is due to the type II structure between the quantum dots and the electron transport layer (ETL), excited electrons in the blue quantum dots (QDs) easily accumulate space charges in the ETL and lead to the rise of the working voltage of the device. Therefore, unlike some very stable red QD devices, the service life of the red QD device is mainly affected by the slow degradation of the hole transport layer, while the reduction in the service life of the blue QLED is caused by the rapid degradation from the QD-ETL junction. Therefore, further improvement of the electrical conductivity and the band gap width of the electron transport layer and obtaining the high-efficiency electron transport materials are the prerequisites for improving the service life of blue quantum dot QLEDs.

Although there have been reports trying to improve the conductivity and band gap width of the electron transport layer, practical applications thereof are not ideal.

SUMMARY

The present application provides a composite electron transport material and a preparation method thereof, and a light-emitting diode containing the composite electron transport material, so as to solve the problems of low electron transport and injection efficiency of the existing electron transport material and high injection barrier between the electron transport layer and the light-emitting layer caused by relatively narrow band gap width of the existing electron transport material.

In an aspect of the present application, a composite electron transport material is provided. The composite electron transport material of the present application comprises a core and at least one shell covering on the core. The core is made of an inorganic electron transport material. The shell is made of a material comprising a metal oxide. A band gap of the metal oxide is wider than a band gap of the inorganic electron transport material.

Furthermore, the metal oxide comprises at least one of $Yb_2O_3$, $La_2O_3$, $LaTi_2O_7$, $Nd_2O_3$, $ZrO_2$, and NiO.

Furthermore, the inorganic electron transport material comprises at least one of ZnO and $TiO_2$.

Furthermore, the shell has a thickness of between 1 nm and 6 nm.

Furthermore, the core has a particle size of between 2 nm and 5 nm.

Furthermore, the shell comprises at least two shell layers, and the core is sequentially covered by the shell in an order that the core is covered by a first shell layer, the first shell layer is covered by a second shell layer. A band gap gradient of the at least two shell layers increases from the core to an outer surface of the shell.

Furthermore, the first shell layer is made of a material comprising at least one of $LaTi_2O_7$ and NiO.

Furthermore, the first shell layer has a thickness of between 1 nm and 3 nm.

Furthermore, the second shell layer is made of a material comprising at least one of $La_2O_3$ and $ZrO_2$.

Furthermore, the second shell layer has a thickness of between 1 nm and 3 nm.

Specifically, the shell is a double-layered structure, and the composite electron transport material is at least one of $ZnO@LaTi_2O_7@La_2O_3$, $ZnO@NiO@ZrO_2$, $TiO_2@LaTi_2O_7@La_2O_3$, $TiO_2@NiO@ZrO_2$; in which, @ represents covering.

Furthermore, a doped thin layer is formed at an interface between the core and the shell.

In another aspect of the present application, a preparation method of a composite electron transport material is provided. The preparation method of the composite electron transport material of the present application comprises the following steps:

respectively providing an inorganic electron transport material particle and a first precursor solution containing a first metal oxide precursor, and preparing the inorganic electron transport material particle into a core dispersion solution; and mixing the core dispersion solution with the first precursor solution and subjecting a resulting mixed solution to a first heat treatment to enable the first metal oxide precursor to undergo a redox reaction and a first metal oxide shell layer to grow in situ on a surface of the inorganic electron transport material particle whereby obtaining a composite particle;

in which, a band gap of a first metal oxide in the first metal oxide shell layer is wider than a band gap of the inorganic electron transport material.

Furthermore, a temperature for the first heat treatment is between 20° C. and 80° C.

Furthermore, in the mixed solution formed by the core dispersion solution and the first precursor solution, a weight ratio of the inorganic electron transport material particle to the first metal oxide precursor is 1:(0.2 to 3).

Furthermore, in the mixed solution formed by the core dispersion solution and the first precursor solution, a first ligand is further added; and a concentration of the first ligand in the mixed solution is between 0.01 mg/mL and 0.5 mg/mL.

Furthermore, the first metal oxide precursor comprises a corresponding metal salt adapted to generate at least one of $Yb_2O_3$, $La_2O_3$, $LaTi_2O_7$, $Nd_2O_3$, $ZrO_2$, and NiO.

Furthermore, the first ligand comprises at least one of ethylene glycol, glycerol, ethanolamine, and tetramethylammonium hydroxide.

Furthermore, the preparation method further includes the following steps:

providing a second precursor solution containing a second metal oxide precursor;

preparing the composite particle into a composite particle dispersion solution; and mixing the composite particle dispersion solution with the second precursor solution and subjecting a resulting mixed solution to a second heat treatment, to enable the second metal oxide precursor to undergo a redox reaction, and a second metal oxide shell to grow in situ on a surface of the composite particle;

in which, a band gap of a second metal oxide in the second metal oxide shell layer is wider than a band gap of the first metal oxide.

Furthermore, a temperature for the second heat treatment is between 20° C. and 80° C.

Furthermore, in the mixed solution formed by the composite particle dispersion solution and the second precursor solution, a weight ratio of the composite particle to the second metal oxide precursor is 1:(0.2 to 3).

Furthermore, in the mixed solution formed by the composite particle dispersion solution and the second precursor solution, a second ligand is further added; and a concentration of the second ligand in the mixed solution is between 0.01 mg/mL and 0.5 mg/mL.

Furthermore, the second metal oxide precursor comprises a corresponding metal salt adapted to generate at least one of $La_2O_3$, $ZrO_2$, $Yb_2O_3$, $LaTi_2O_7$, $Nd_2O_3$, and NiO.

Furthermore, the second ligand comprises at least one of ethylene glycol, glycerol, ethanolamine, and tetramethylammonium hydroxide.

In yet another aspect of the present application, a light-emitting diode is provided. The light-emitting diode of the present application includes an electron transport layer, and the material of the electron transport layer includes the composite electron transport material according to embodiments of the present application or the composite electron transport material prepared by the preparation method of the composite electron transport material according to embodiments of the present application.

Furthermore, the light-emitting diodes are QLED and OLED.

Furthermore, the light-emitting diodes are blue light-emitting diodes.

Compared with the prior art, the present application has the following technical effects:

The composite electron transport material of the present application adopts a metal oxide having a relatively wide band gap as the shell and a metal oxide having a relatively narrow band gap as a core inorganic electron transport material, so as to realize the synergistic effect between the metal oxide and the inorganic electron transport material, so that the metal oxide can effectively passivate the surface defects of the inorganic electron transport material, and form a doped conductive film layer at the coating interface of the inorganic electron transport material particle, and meanwhile increase the band gap of the inorganic electron transport material and improve the conduction band energy level of the inorganic electron transport material, thereby effectively improving the electrical conductivity and the electron transport and injection ability of the composite electron transport material, effectively reducing the exciton quenching in the light-emitting materials such as quantum dots by the composite electron transport material, reducing the electron injection barrier between the electron transport layer formed by the electron transport material and the light-emitting layer such as the quantum dot light-emitting layer, effectively improving the luminous efficiency and the service life of the light-emitting diode containing the electron transport layer formed by the composite electron transport material, and optionally, a blue light-emitting diode.

In the preparation method of the composite electron transport material of the present application, at least one shell layer of a metal oxide containing a wide band gap is grown in situ on the surface of the inorganic electron transport material particle, on the one hand, this can enable the metal oxide containing the wide band gap and the inorganic electron transport material to play a synergistic effect in the above composite electron transport material of the present application, so that the surface defects of the inorganic electron transport material contained in the prepared composite electron transport material can be effectively passivated, and the band gap, the conduction band energy level, and the electrical conductivity of the inorganic electron transport material are increased; on the other hand, the preparation conditions are easy to control, so that the prepared composite electron transport material has stable performance, high preparation efficiency, and low production cost.

Since the material of the electron transport layer contained in the light-emitting diode of the present application is the composite electron transport material of the present application, the electron transport layer has high electron transport and injection efficiency, which can effectively reduce the exciton quenching in the light-emitting layer, and reduce the electron injection barrier between the electron transport layer and the light-emitting layer, and the luminous efficiency and service life of the light-emitting diode are improved.

BRIEF DESCRIPTION OF THE DRAWINGS

In order to more clearly illustrate the technical solutions in the embodiments of the present application, the drawings that need to be used in the description of the embodiments or the prior art will be briefly described hereinbelow. Obviously, the accompanying drawings in the following description are only some embodiments of the present application. For those skilled in the art, other drawings can be obtained based on these drawings without creative work.

FIG. 3 is a schematic diagram of a process flow of a preparation method of a composite electron transport material according to the embodiment of the present application;

FIG. 4 is a schematic structural diagram of a light-emitting diode in an upright structure according to an embodiment of the present application;

DETAILED DESCRIPTION OF THE EMBODIMENTS

In order to make the purposes, technical solutions, and advantages of the present application clearer and more understandable, the present application will be further described in detail hereinafter with reference to the accompanying drawings and embodiments. It should be understood that the embodiments described herein are only intended to illustrate but not to limit the present application. Based on the embodiments in the present application, those of ordinary skill in the art can obtain all other The embodiments all belong to the protection scope of the present application.

Figures 1, 2:
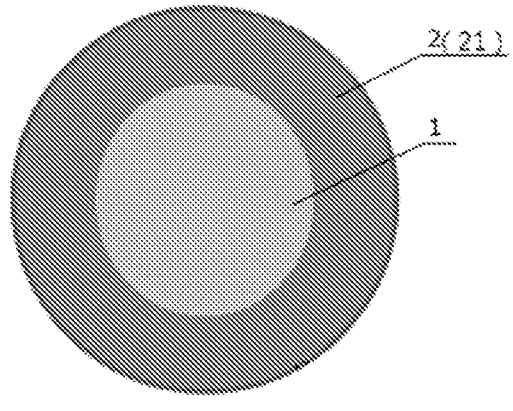
FIG. 1 is a schematic structural diagram of a composite electron transport material containing a single-layered shell according to an embodiment of the present application.
FIG. 2 is a schematic structural diagram of a composite electron transport material containing a double-layered shell according to an embodiment of the present application.

In one aspect, embodiments of the present application provide a composite electron transport material. The composite electron transport material has a core-shell structure, as shown in FIG. 1 and FIG. 2, which includes a core 1 and a shell 2 covering the core 1.

The core 1 contained in the composite electron transport material is made of an inorganic electron transport material. The inorganic electron transport material may be a conventional inorganic electron transport material. For example, in an embodiment, the inorganic electron transport material includes at least one of ZnO and $TiO_2$.

In addition, by controlling a diameter of the core 1, the electron transport effect of the inorganic electron transport material can be effectively exerted. In an embodiment, the core 1 is a nanoparticle, for example, having a particle size of between 2 nm and 5 nm. Inorganic electron transport materials with the diameters in such a range have better crystallinity, which is beneficial to the coating of the shell and the doping of the core-shell interface.

The material of the shell 2 contained in the composite electron transport material includes metal oxide, and the band gap of the metal oxide is wider (that is, higher than) the band gap of the inorganic electron transport material. In this way, the shell 2 adopts a metal oxide having a relatively wide band gap, which is used as the material of the shell 2 to coat the core 1, which is also to coat the inorganic electron transport material particle, so that the synergistic effect between the metal oxide and the inorganic electron transport material enables the metal oxide to effectively passivate the surface defects of inorganic electron transport material, and can also increase the band gap of inorganic electron transport material and improve the conduction band energy level of inorganic electron transport material, so as to effectively reduce exciton quenching of the light-emitting material such as quantum dots by the composite electron transport material of the embodiments of the present application, and to reduce the electron injection battier between the electron transport layer formed by the composite electron transport material of the embodiments of the present application and the light-emitting layer such as the quantum dot light-emitting layer. In addition, a thin doped layer can be formed at the interface between the core 1 and the shell 2, the doping is controllable, and each layer on the surface of the core 1 can be uniformly doped, which can improve the electrical conductivity and electron mobility of the core 1. Therefore, the light-emitting diode containing the electron transport layer formed of the composite electron transport material of the embodiments of the present application can further be a blue light-emitting diode having high luminous efficiency and long service life. In a specific embodiment, the metal oxide includes at least one of $Yb_2O_3$, $La_2O_3$, $LaTi_2O_7$, $Nd_2O_3$, $ZrO_2$, and NiO. The band gaps of these metal oxides are all wider than those of inorganic electron transport materials, among which, the band gap of $Yb_2O_3$ is 4.9 eV, the band gap of $La_2O_3$ is 5.5 eV, the band gap of $LaTi_2O_7$ is 4.0 eV, the band gap of $Nd_2O_3$ is 4.7 eV, the band gap of $ZrO_2$ is 5.0 eV, and the band gap of NiO is 3.5 eV. The band gaps of these metal oxides are wider than those of inorganic electron transport materials, such as higher than the band gap of ZnO which is 3.2 eV, so as to improve the synergetic interaction with the core 1.

In addition, the shell 2 may be at least one layer, such as one layer or at least two layers. When the shell 2 is a single layer as shown in FIG. 1, the band gap of the metal oxide contained in the shell 2 is wider than the band gap of the inorganic electron transport material in the core 1. In this way, the composite electron transport material can be specifically $ZnO@Yb_2O_3$, $ZnO@La_2O_3$, $ZnO@LaTi_2O_7$, $ZnO@Nd_2O_3$, $ZnO@ZrO_2$, $ZnO@NiO$, in which, A represents covering, such as $ZnO@Yb_2O_3$ represents $Yb_2O_3$ covering ZnO.

When the shell 2 includes at least two layers, the core 1 is sequentially covered by the shell 2 in an order that the core 1 is covered by a first shell layer, the first shell layer is covered by a second shell layer, and the second shell layer is covered by a third shell layer; and a band gap gradient of the at least two shell layers increases from the core 1 to an outer surface of the shell 2. However, it is still necessary to satisfy that the band gap of the metal oxide contained in each shell layer is wider than that of the inorganic electron transport material. Specifically, as shown in FIG. 2, the shell 2 includes a first shell layer 21 and a second shell layer 22, the first shell layer 21 covers the core 1, and the second shell layer 22 covers the first shell layer 21. Moreover, the band gaps of the metal oxides contained in the first shell layer 21 and the second shell layer 22 are wider than that of the inorganic electron transport material, and the band gap of the metal oxide contained in the second shell layer 22 is wider than that of the metal oxide contained in the first shell layer 21. Therefore, in a specific embodiment, the composite electron transport material may be at least one of $ZnO@LaTi_2O_7@La_2O_3$, $ZnO@NiO@ZrO_2$, $TiO_2@LaTi_2O_7@La_2O_3$, $TiO_2@NiO@ZrO_2$; in which, @ represents covering. For example, $ZnO@LaTi_2O_7@La_2O_3$ means that $La_2O_3$ serves as the second shell layer 22, $La_2O_3$ serves as the first shell layer 21, $La_2O_3$ covers $LaTi_2O_7$, and $LaTi_2O_7$ covers ZnO. In this way, the shell 2 is in a structure of multiple layers and the band gap of each shell layer is controlled to increase gradually from the inside to the outside, that is, the band gap of the metal oxide contained in each shell layer is gradually increased from the inside to the outside, so that the shell 2 in the composite structure can play a synergistic effect with the inorganic electron transport material, further passivate the surface defects and conductivity of inorganic electron transport material, and gradually increase the band gap and conduction band energy level of inorganic electron transport materials, so as to further improve the exciton quenching of the light-reflecting material quantum dots by the composite electron transport material, further reduce an electron injection barrier between the electron transport layer formed by the composite electron transport material and the light-emitting layer such as the quantum dot light-emitting layer.

On the basis of the above embodiments, in an embodiment, the thickness of the shell 2 is between 1 nm and 6 nm. When the shell 2 is a composite structure having more than two layers as shown in FIG. 2, the thickness of the first shell layer 21 is between 1 nm and 3 nm, and the thickness of the second shell layer 22 is between 1 nm and 3 nm. By optimizing the thickness of the shell 2, the band gap modification effect of the shell 2 on the core 1 is improved, the band gap and the conduction band energy level of the inorganic electron transport material are improved, and the surface defects of the inorganic electron transport material are effectively passivated.

Therefore, the composite electron transport material in the above embodiments can improve the band gap, the conduction band energy level, and the conductivity of the inorganic electron transport material through the modification of the shell 2 and the core 1, and effectively passivate the surface defects of the inorganic electron transport material, so that the electron transport and injection efficiency of the composite electron transport material can be effectively improved, the exciton quenching phenomenon of the light-emitting materials, such as quantum dots, by the composite electron transport material can be reduced, and the electron injection barrier between the electron transport layer and the light-emitting layer can be reduced. Therefore, the light-emitting diode containing the electron transport layer formed of the composite electron transport material according to embodiments of the present application can further be a blue light-emitting diode, which has a high luminous efficiency and a long service life.

Correspondingly, the embodiments of the present application also provide a preparation method of the above composite electron transport material, with reference to FIG. 1 and FIG. 2, a process flow of the preparation method of composite electron transport material is shown in FIG. 3, the preparation includes the following steps:

In step S01, an inorganic electron transport material particle and a first precursor solution containing a first metal oxide precursor are respectively provided, and the inorganic electron transport material particle is prepared into a core dispersion solution;

In step S02, the core dispersion solution obtained in step S01 is mixed with the first precursor solution and a resulting mixed solution is subjected to a first heat treatment to enable the first metal oxide precursor to undergo a redox reaction and a first metal oxide shell layer to grow in situ on a surface of the inorganic electron transport material particle whereby obtaining a composite particles;

In a further embodiment, the preparation method of the composite electron transport material further includes the following steps:

In step S03, a second precursor solution containing a second metal oxide precursor is provided, and the composite particle is prepared into a composite particle dispersion solution; and In step S04, the composite particle dispersion solution obtained in step S03 is mixed with the second precursor solution and a resulting mixed solution is subjected to a second heat treatment, to enable the second metal oxide precursor to undergo a redox reaction, and a second metal oxide shell to grow in situ on a surface of the composite particle.

In step S01, the inorganic electron transport material particle is the inorganic electron transport material particle of the core 1 contained in the above composite electron transport material, and the first metal oxide precursor is the precursor having a wide bandgap metal oxide contained in the shell 2, which is specifically the shell 2 as shown in FIG. 1, or the first shell layer 21 as shown in FIG. 2, contained in the above composite electron transport material, therefore, the first metal oxide precursor may be a corresponding metal salt adapted to generate at least one of $Yb_2O_3$, $La_2O_3$, $LaTi_2O_7$, $Nd_2O_3$, $ZrO_2$, and $NiO$, which is specifically $Yb(NO_3)_3$, $La(NO_3)_3$, $Ti(NO_3)_4$, $Nd(NO_3)_3$, $Zr(NO_3)_4$, $Ni(NO_3)_2$, and the like.

A solvent of the first precursor solution can be a solvent that is favorable for dissolving the first metal oxide precursor, including but not limited to ethanol, dimethyl sulfoxide, and the like. In an embodiment, a concentration of the first metal oxide precursor in the first precursor solution is between 1 mol/mL and 100 mol/mL.

In an embodiment, a solvent of the core dispersion solution is a solvent capable of sufficiently dispersing the inorganic electron transport material particles and dissolving the first metal oxide precursor, including but not limited to ethanol, dimethyl sulfoxide, and the like. In an embodiment, the concentration of the inorganic electron transport material particle in the core dispersion solution is between 1 mol/mL and 100 mol/mL.

The first heat treatment in step S02 is to heat the mixed solution, so that the first metal oxide precursor of the mixed solution is heated to undergo a redox reaction, and the first metal oxide is formed in situ on the surface of the inorganic electron transport material particle, so that the surface of the inorganic electron transport material particle is coated in situ with the first metal oxide, to form the shell 2 as shown in FIG. 1 or the first shell layer 21 as shown in FIG. 2. In such condition, the coated inorganic electron transport material particle serves as the core 1 as shown in FIGS. 1-2. Since the first metal oxide is oxidized by the wide band gap metal contained in the shell 2 of the composite electron transport material, the band gap of the first metal oxide generated by the redox reaction is wider than that of the inorganic electron transport material.

In an embodiment, in the mixed solution formed by the core dispersion solution and the first precursor solution in step S02, a weight ratio of the inorganic electron transport material particle to the first metal oxide precursor is 1:(0.2 to 3). Based on this ratio range, the thickness of the first metal oxide shell layer can be effectively controlled and adjusted.

In another embodiment, the conditions of the first heat treatment are as follows: the temperature is between 20° C. and 80° C., further between 20° C. and 30° C., and the time for the heat treatment time at such temperature should be sufficient, for example, the time is between 30 mins and 180 mins. By controlling and optimizing the first heat treatment conditions, the first metal oxide precursor can be fully oxidized to form a metal oxide having a wide band gap and being uniformly coated on the surface of the inorganic electron transport material particle, which improves the surface modification of the inorganic electron transport material particles by the first metal oxide, and enables the first metal oxide to more effectively passivate the surface defects of the inorganic electron transport material particle, and increases the conduction band energy level of the inorganic electron transport material, thereby effectively reducing exciton quenching in the light-emitting material, such as the quantum dots, by the composite electron transport material. Furthermore, through the in situ growth method, the generated first metal oxide can be doped on the surface of the inorganic electron transport material, that is, the interface between the core 1 and the shell 2 can be adopted to form a doped film layer, so as to improve conductivity and electron mobility of the core 1.

In a further embodiment, a first ligand is also added to the mixed solution formed by the core dispersion solution and the first precursor solution. By adding the first ligand, the metal ions contained in the first metal oxide precursor and the composite particles generated by the redox reaction are uniformly dispersed to avoid agglomeration, and the grown first metal oxide shell layer is more uniform. In an embodiment, the concentration of the first ligand in the mixed solution is between 0.01 mg/mL and 0.5 mg/mL. In a specific embodiment, the first ligand includes at least one of ethylene glycol, glycerol, ethanolamine, and tetramethylammonium hydroxide.

In step S03, the second metal oxide precursor is a metal oxide having a wide band gap contained in the shell 2, specifically the shell 22 as shown in FIG. 2, contained in the above composite electron transport material. Therefore, the second metal oxide precursor can be a corresponding metal salt capable of generating at least one of $La_2O_3$, $ZrO_2$, $Yb_2O_3$, $LaTi_2O_7$, $Nd_2O_3$, and NiO, then the second metal oxide precursor can be a corresponding metal salt capable of generating at least one of $La_2O_3$, $ZrO_2$, $Yb_2O_3$, $LaTi_2O_7$, $Nd_2O_3$ and NiO, specifically, such as $Yb(NO_3)_3$, $La(NO_3)_3$, $Ti(NO_3)_4$, $Nd(NO_3)_3$, $Zr(NO_3)_4$, $Ni(NO_3)_2$ and the like. However, the band gap of the second metal oxide generated by the second metal oxide precursor should be wider (that is, higher than) the band gap of the first metal oxide generated by the first metal oxide precursor in step S01.

The solvent of the second precursor solution may be a solvent favorable for dissolving the second metal oxide precursor, such as ethanol, dimethyl sulfoxide, and the like. In an embodiment, the concentration of the second metal oxide precursor in the second precursor solution is between 1 mol/mL and 100 mol/mL.

In an embodiment, the solvent of the composite particle dispersion solution is a solvent capable of sufficiently dispersing the composite particle and dissolving the second metal oxide precursor, such as ethanol, dimethyl sulfoxide, and the like. In an embodiment, the concentration of the composite particle in the composite particle dispersion solution is between 1 mg/mL and 100 mg/mL.

The effect of the second heat treatment in step S04 is the same as that of the first heat treatment in step S02, which enables the second metal oxide precursor of the mixed solution to undergo a redox reaction after being heated, and a second metal oxide is formed in situ on the surface of the first metal oxide shell layer, so that the second metal oxide covers the surface of the first metal oxide shell layer in situ to form the second shell layer 22 as shown in FIG. 2. In such condition, the first metal oxide shell layer is the first shell layer 21 as shown in FIG. 2. Since the second metal oxide is the metal oxide having a wide band gap contained in the second shell layer 22 of the above composite electron transport material, the band gap of the second metal oxide generated by the redox reaction is wider than that of the first metal oxide.

In an embodiment, in the mixed solution formed by the composite particle dispersion solution and the second precursor solution in step S04, a weight ratio of the composite particle to the second metal oxide precursor is 1:(0.2 to 3). Based on this ratio range, the thickness of the second metal oxide shell layer can be effectively controlled and adjusted.

In another embodiment, the conditions of the second heat treatment are as follows: the temperature is between 20° C. and 80° C., further between 60° C. and 80° C., and the time for heat treatment at this temperature should be sufficient, for example, the time is between 30 mins and 180 mins. By controlling and optimizing the second heat treatment conditions, the second metal oxide precursor can be fully oxidized to form a metal oxide having a wide band gap and being uniformly coated on the surface of the first metal oxide, thereby improving the coating of the second metal oxide on the surface of the first metal oxide.

In a further embodiment, a second ligand is also added to the mixed solution formed by the composite particle dispersion solution and the second precursor solution. By adding the second ligand, the metal ions contained in the second metal oxide precursor and the composite particles generated by the redox reaction are uniformly dispersed to avoid agglomeration, and the grown second metal oxide shell layer is more uniform. In an embodiment, the concentration of the second ligand in the mixed solution is between 0.01 mg/mL and 0.5 mg/mL. In a specific embodiment, the second ligand includes at least one of ethylene glycol, glycerol, ethanolamine, and tetramethylammonium hydroxide.

It can be understood that, after step S04, a third precursor solution containing a third metal oxide precursor and a fourth precursor solution containing a fourth metal oxide precursor may also be provided, and then the steps in step S04 are sequentially repeated, and multiple shell layers are sequentially formed from the core 1 outwards. For example, referring to the steps in S04, the third precursor solution is subjected to a third redox reaction to grow a third metal oxide shell layer in situ on the surface of the second metal oxide shell layer, and then also referring to the steps in S04, the fourth precursor solution is subjected to a fourth redox reaction to grow a fourth metal oxide shell layer in situ on the surface of the third metal oxide shell layer. By repeating steps S03 and S04 in this way, at least two or more shell layers 2 are formed on the surface of the inorganic electron transport material particle in step S01, and in a direction from the core 1 to the outer surface of the shell 2, the band gap gradient of all shell layers increases.

Therefore, in the preparation method of the composite electron transport material in the above embodiments, at least one metal oxide shell 2 containing a wide band gap is grown in situ on the surface of the inorganic electron transport material particle, which can make the metal oxide having the wide band gap and the inorganic electron transport material play a synergistic effect in the above composite electron transport material of the present application, so that the surface defects of the inorganic electron transport material contained in the prepared composite electron transport material can be effectively passivated, and the band gap, the conduction band energy level, the electrical conductivity of the inorganic electron transport material can be increased. Moreover, the preparation conditions are easy to control, so that the prepared composite electron transport material has stable performance, high preparation efficiency, and low production cost.

On the other hand, based on the composite electron transport material and the preparation method thereof, the embodiments of the present application also provide a light-emitting diode (electroluminescent diode). The light-emitting diode includes an electron transport layer. It can be understood that the light-emitting diode also contains other layers which are necessary for the light-emitting diode, such as a light-emitting layer, an anode, a cathode, and a hole functional layer. The material of the electron transport layer includes the composite electron transport material of the above embodiments of the present application. In this way, based on the advantages of the above composite electron transport material, the electron transport layer contained in the light-emitting diode can effectively reduce the exciton quenching phenomenon in the light-emitting layer, and the electron injection barrier between the electron transport layer and the light-emitting layer is small, so that the luminous efficiency, the intensity, and the service life of light-emitting diodes can be effectively improved, especially the luminous efficiency, the intensity, and the service life of the blue light-emitting diodes can be effectively improved.

In addition, according to the above composite electron transport material contained in the electron transport layer of the light-emitting diode and the functions as explained in the above, not only the quantum dots but also the luminous efficiency of the organic fluorescent material can be excited. Therefore, the light-emitting material of the light-emitting layer may be a quantum dot or an organic fluorescent light-emitting material, and the light-emitting diode in the embodiments of the present application may be a quantum dot light-emitting diode (QLED) or an organic electroluminescent diode (OLED). And also based on the above composite electron transport material contained in the electron transport layer of the light-emitting diode and the functions as explained in the above, the material of the reflective layer can be a blue light-emitting material such as a blue quantum dot light-emitting material and/or a blue organic fluorescent light-emitting material, thereby effectively prolonging the luminous efficiency of the blue light-emitting diode, thereby improving the commercial application value of the blue light-emitting diode.

Secondly, according to the structural arrangement of the light-emitting diode, the light-emitting diode in the embodiment of the present application may be a light-emitting diode in an upright structure or a light-emitting diode in an inversion structure.

In an embodiment, a structure of an upright light-emitting diode is shown in FIG. 4, and includes a stacked structure of an anode 10 and a cathode 50 disposed opposite to each other, the anode 10 can be stacked on the substrate 01. A light-emitting functional layer is stacked onto the cathode 50. The light-emitting functional layer includes a light-emitting layer 30, a hole transport layer 20, and an electron transport layer 40. In a direction from the anode 10 to the cathode 50, the hole transport layer 20, the light-emitting layer 30, and the electron transport layer 40 are sequentially stacked. A hole injection layer (not shown in FIG. 4) may also be arranged between the hole transport layer 20 and the anode 10, and an electron injection layer (not shown in FIG. 4) may also be arranged between the electron transport layer 40 and the cathode 50.

Therefore, during the preparation of the light-emitting diode in the upright structure as shown in FIG. 4, (optionally, a hole injection layer) a hole transport layer 20, a light-emitting layer 30, an electron transport layer 40, (or further forming a hole injection layer), and the cathode 50 are sequentially formed on the surface of the anode 10.

Figure 5:
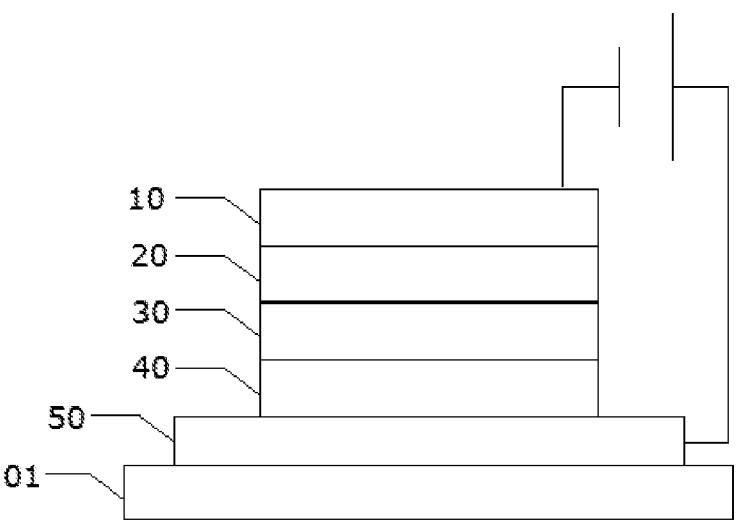
FIG. 5 is a schematic structural diagram of a light-emitting diode in an inversion structure according to an embodiment of the present application.

In another embodiment, the structure of an inverse light-emitting diode is shown in FIG. 5, which includes a stacked structure of an anode 10 and a cathode 50 arranged oppositely, in which, the cathode 50 can be stacked on the substrate 01, a light-emitting functional layer is stacked and bonded between the cathode 10 and the cathode 50. The light-emitting functional layer includes a light-emitting layer 30, a hole transport layer 20, and an electron transport layer 40. In a direction from the anode 10 to the cathode 50, the hole transport layer 20, the light-emitting layer 30, and the electron transport layer 40 are sequentially stacked. A hole injection layer (not shown in FIG. 5) may also be disposed between the hole transport layer 20 and the anode 10, and an electron injection layer (not shown in FIG. 5) may be disposed between the electron transport layer 40 and the cathode 50.

Therefore, during the preparation of the inverse light-emitting diode as shown in FIG. 5, on the surface of the cathode 50 are sequentially formed (the electron injection layer is formed firstly when there is an electron injection layer) the electron transport layer 40, the light-emitting layer 30, the hole transport layer 20, (when there is a hole injection layer, a hole injection layer is further formed on the surface of the hole transport layer 20), the anode 10.

In order to make the above-mentioned implementation details and operations of the present application clearly understood by those skilled in the art, and to make the improved performances of the composite electron transport materials, hole injection composite materials, hole transport composite materials, and light-emitting diodes, and preparation methods thereof in the embodiments of the present application notable, the above technical solutions are illustrated by a plurality of examples hereinbelow.

1. Example of Composite Electron Transport Material and Preparation Method Thereof

Example 11

This example provides a composite electron transport material and a preparation method thereof. The composite electron transport material is a ZnO@Yb$_2$O$_3$ core-shell structure particle having a single-layered shell shown in FIG. 1, in which, the particle size of the core ZnO is averagely distributed between 2 nm and 5 nm, and the thickness of the shell Yb$_2$O$_3$ is between 1 nm and 3 nm.

The preparation method of ZnO@Yb$_2$O$_3$ was conducted with the following steps:

S1. Preparation of Yb$_2$O$_3$ precursor solution: Yb(NO$_3$)$_3$ and ethanol solution were mixed and stirred to prepare a 150 mg/mL solution;

S2. Preparation of a mixed solution containing Yb$_2$O$_3$ precursor and zinc oxide (ZnO) nanoparticle: 50 mg/mL of a ZnO nanoparticle in an ethanol solution and a prepared Yb$_2$O$_3$ precursor solution were mixed according to a weight ratio of 1:1.5; and S3. In situ generation of ZnO@Yb$_2$O$_3$: 25 mg of tetramethylammonium hydroxide was added to the mixed solution obtained in step S2, then the mixed solution was heated to 50° C. for heat treatment to make the Yb$_2$O$_3$ precursor undergo a redox reaction, and the Yb$_2$O$_3$ shell was grown in situ on the surface of the ZnO particle, thereby obtaining ZnO@Yb$_2$O$_3$.

Example 12

This example provides a composite electron transport material and a preparation method thereof. The composite electron transport material is a ZnO@La$_2$O$_3$ core-shell structure particle having a single-layered shell shown in FIG. 1, in which, the particle size of the core ZnO is averagely distributed between 2 nm and 5 nm, and the thickness of the shell La$_2$O$_3$ is between 1 nm and 3 nm.

The preparation method of ZnO@La$_2$O$_3$ was conducted with the following steps:

S1. Preparation of La$_2$O$_3$ precursor solution: La$_2$O$_3$ and dimethyl sulfoxide were mixed and stirred to prepare a 150 mg/mL solution;

S2. Preparation of a mixed solution containing La$_2$O$_3$ precursor and zinc oxide (ZnO) nanoparticle: 50 mg/mL of a ZnO nanoparticle in an ethanol solution and a prepared La$_2$O$_3$ precursor solution were mixed according to a weight ratio of 1:1.5; and S3. In situ generation of ZnO@La$_2$O$_3$: 25 mg of KOH was added to the mixed solution obtained in step S2, then the mixed solution was heated to 50° C. for heat treatment to make the La$_2$O$_3$ precursor undergo a redox reaction, and the La$_2$O$_3$ shell was grown in situ on the surface of the ZnO particle, thereby obtaining ZnO@La$_2$O$_3$.

Example 13

This example provides a composite electron transport material and a preparation method thereof. The composite electron transport material is a ZnO@LaTi$_2$O$_7$ core-shell structure particle having a single-layered shell shown in FIG. 1, in which, the particle size of the core ZnO is averagely distributed between 2 nm and 5 nm, and the thickness of the shell LaTi$_2$O$_7$ is between 1 nm and 3 nm.

The preparation method of ZnO@LaTi$_2$O$_7$ composite electron transport material was conducted with the following steps:

S1. Preparation of LaTi$_2$O$_7$ precursor solution: La(NO$_3$)$_3$ and Ti(NO$_3$)$_4$ having a molar ratio of 1:2 and an aqueous ethanol solution were mixed and stirred to prepare a 150 mg/mL solution;

S2. Preparation of a mixed solution containing LaTi$_2$O$_7$ precursor and zinc oxide (ZnO) nanoparticle: 50 mg/mL of a ZnO nanoparticle in an ethanol solution and a prepared LaTi$_2$O$_7$ precursor solution were mixed according to a weight ratio of 1:1.5; and S3. In situ generation of ZnO@ LaTi$_2$O$_7$: 25 mg of tetramethylammonium hydroxide was added to the mixed solution obtained in step S2, then the mixed solution was heated to 50° C. for heat treatment to make the LaTi$_2$O$_7$ precursor undergo a redox reaction, and the LaTi$_2$O$_7$ shell was grown in situ on the surface of the ZnO particle, thereby obtaining ZnO@ LaTi$_2$O$_7$.

Example 14

This example provides a composite electron transport material and a preparation method thereof. The composite electron transport material is a ZnO@LaTi$_2$O$_7$@La$_2$O$_3$ core-shell structure particle having a double-layered shell as shown in FIG. 2, in which, the particle size of the core ZnO is averagely distributed between 2 nm and 5 nm; the first shell layer is LaTi$_2$O$_7$ and has a thickness of between 1 nm and 3 nm; and the second shell layer is La$_2$O$_3$ and has a thickness of between 1 nm and 3 nm.

The preparation method of the ZnO@LaTi$_2$O$_7$@La$_2$O$_3$ composite electron transport material was conducted with the following steps:

S1. Preparation of LaTi$_2$O$_7$ precursor solution: La(NO$_3$)$_3$ and Ti(NO$_3$)$_4$ having a molar ratio of 1:2 and an aqueous ethanol solution were mixed and stirred to prepare a 150 mg/mL solution;

Preparation of La$_2$O$_3$ precursor solution: La(NO$_3$)$_3$ and an ethanol aqueous solution were mixed and stirred to prepare a 150 mg/mL solution;

S2. Preparation of a mixed solution containing LaTi$_2$O$_7$ precursor and zinc oxide (ZnO) nanoparticle: 50 mg/mL of a ZnO nanoparticle in an ethanol solution and a prepared LaTi$_2$O$_7$ precursor solution were mixed according to a weight ratio of 1:1.5.

S3. In situ generation of ZnO@ LaTi$_2$O$_7$: 25 mg of tetramethylammonium hydroxide was added to the mixed solution obtained in step S2, then the mixed solution was heated to 50° C. for heat treatment to make the LaTi$_2$O$_7$ precursor undergo a redox reaction, and the LaTi$_2$O$_7$ shell was grown in situ on the surface of the ZnO particle, thereby obtaining ZnO@ LaTi$_2$O$_7$; and S4. In situ generation of ZnO@LaTi$_2$O$_7$@La$_2$O$_3$: the La$_2$O$_3$ precursor solution prepared in step S1 was mixed with the dispersion solution containing the ZnO@LaTi$_2$O$_7$ generated in step S3, and a resulting mixed solution was heated and added with 25 mg of tetramethylamine hydroxide, heated to 50° C. for heat treatment to make the La$_2$O$_3$ precursor undergo a redox reaction, and in situ the La$_2$O$_3$ shell layer was grown on the surface of the LaTi$_2$O$_7$ shell layer, whereby obtaining ZnO@LaTi$_2$O$_7$@La$_2$O$_3$.

Example 15

This example provides a composite electron transport material and a preparation method thereof. The composite electron transport material is a ZnO@NiO@ZrO$_2$ core-shell structure particle having a double-layered shell shown in FIG. 2, in which the particle size of the core ZnO is averagely distributed between 2 nm and 5 nm; the first shell is NiO and has a thickness of between 1 nm and 3 nm; the second shell is ZrO$_2$ and has a thickness of between 1 nm and 3 nm.

The preparation method of ZnO@NiO@ZrO$_2$ composite electron transport material was conducted with the following steps:

S1. Preparation of NiO precursor solution: Ni(NO$_3$)$_2$ and an ethanol aqueous solution were mixed and stirred to prepare a 0.2 mg/mL to 300 mg/mL solution;

Preparation of ZrO$_2$ precursor solution: Zr(NO$_3$)$_4$ and an ethanol aqueous solution were mixed and stirred to prepare a 0.2 mg/mL to 300 mg/mL solution;

S2. Preparation of a mixed solution containing NiO precursor and zinc oxide (ZnO) nanoparticle: 50 mg/mL of a ZnO nanoparticle in an ethanol solution and a prepared NiO precursor solution were mixed according to a weight ratio of 1:1.5;

S3. In situ generation of ZnO@NiO: 25 mg of tetramethylamine hydroxide was added to the mixed solution in step S2, and heated to 50° C. for heat treatment to make the NiO precursor undergo a redox reaction, and the NiO shell was grown in situ on the surface of the ZnO particle, whereby obtaining ZnO@NiO; and S4. In situ generation of ZnO@NiO@ZrO$_2$: the ZrO$_2$ precursor solution prepared in step S1 was mixed with the dispersion solution containing the ZnO@NiO generated in step S3, and add between 0.1 mg and 50 mg of tetramethylamine hydroxide was added, a resulting mixed solution was heated to 50° C. for heat treatment to make the ZrO$_2$ precursor undergo a redox reaction, and the ZrO$_2$ shell was grown in situ on the surface of the NiO shell, whereby obtaining ZnO@NiO@ZrO$_2$.

Comparative Example 11

Figure 6:
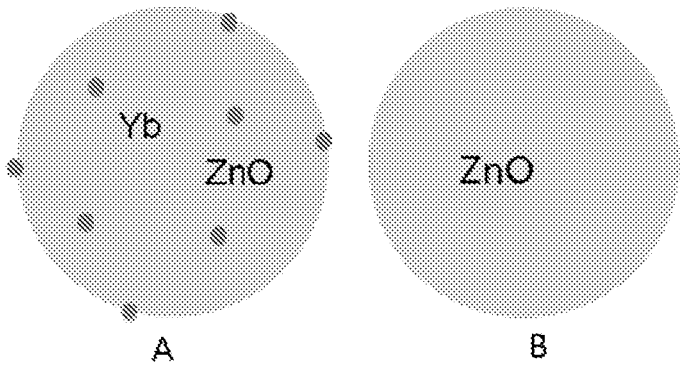
FIG. 6 is a schematic structural diagram of a doped zinc oxide provided by Comparative Example 11.

This Comparative Example provides a doped zinc oxide (ZnO) material. The doped zinc oxide is doped with Yb. The material structure is shown in FIG. 6, in which, a Yb doping ratio is 5% on average. In the doped zinc oxide, the precursor of Yb and the precursor of ZnO are directly mixed, and then synthesized by the existing one-step method to yield the doped zinc oxide.

For the synthesis of zinc oxide (ZnO) nanoparticles, between 3 mmol and 10 mmol of Zn(CH$_3$COO)$_2$ and 25 mg of tetramethylammonium hydroxide in ethanol or dimethyl sulfoxide (50 mL) were mixed and stirred at 50° C., and heated for between 30 mins and 180 mins, after centrifugal cleaning, an ethanol solution of zinc oxide nanoparticles having averagely distributed particle size of between 2 nm and 5 nm was obtained.

The lattice analysis of doped zinc oxide provided in Comparative Example 11 shows that the doping metal is randomly assigned to each ZnO nanoparticle, and the doping concentration in each ZnO nanoparticle is inconsistent, as shown in FIG. 6(A), which indicates a doped ZnO nanoparticle, and in FIG. 6(B), which indicates a non-doped ZnO nanoparticle, the doping position is uncontrollable, and the doping is not uniform, which will affect the consistency of the mobility and conductivity of the ZnO nanoparticle film; and a large number of defect states exist on the surface of ZnO, which will result in the QD exciton quenching; in addition, the surface energy of ZnO is large, which will further grow and mature, thereby being unstable, and the feasibility of mass production is low.

Comparative Example 12

Figure 7:
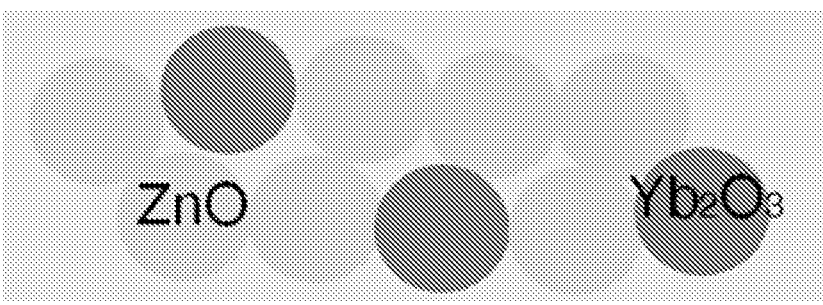
FIG. 7 is a schematic structural diagram of a zinc oxide-containing composition provided in Comparative Example 12.

This Comparative example provides a zinc oxide (ZnO)-containing composition material, and the zinc oxide (ZnO)-containing composition is a mixture of ZnO and Yb$_2$O$_3$. A schematic diagram of the composition is shown in FIG. 7. The composition is prepared by separately preparation of ZnO and Yb$_2$O$_3$, and then mixing the two in a ratio of 100:5.

According to the analysis of the zinc oxide-containing composition material provided in Comparative Example 12, although the mixture of ZnO and Yb$_2$O$_3$ contains Yb$_2$O$_3$ nanoparticles, the mobility and conductivity of ZnO nanoparticles cannot be effectively improved, and the conduction band energy level of ZnO cannot be improved, the defect state of ZnO surface cannot be improved, the surface energy of ZnO cannot be reduced, and the stability of ZnO nanoparticles cannot be improved.

2. Examples of Light-Emitting Diodes and Methods of Making the Same

Example 21

This example provides a QLED light-emitting diode and a manufacturing method thereof. QLED light-emitting diode is an upright quantum dot light-emitting diode, which includes ITO (15 nm)/Ag (110 nm)/ITO (55 nm)/PEDOT: PSS hole injection layer (30 nm)/TFB hole transport layer (30 nm)/ZnCdSeSZnS quantum dot emission layer (25 nm)/ZnO@Yb$_2$O$_3$ electron transport layer (30 nm)/Ag cathode (15 nm), in which, "I" expresses the connection relationship of the layered bonded structure. The ZnO@Yb$_2$O$_3$ electron transport layer is the core-shell structure particles of ZnO@Yb$_2$O$_3$ provided in the above Example 11.

The preparation method of the QLED of the present example was conducted with the following steps:

S1: a first electrode was prepared on a transparent substrate, and the first electrode can select ITO/Ag/ITO as a total reflection electrode;

S2: A hole injection layer was prepared on the first electrode by spin coating. The material of the hole injection layer was PEDOT: PSS AI4083. The spin coating speed was between 3000 rpm and 5000 rpm, and the prepared hole injection layer was conducted with heat treatment at 150° C. for 15 mins in air.

S3: The hole transport layer was prepared by spin coating on the hole injection layer. The hole transport material was TFB, the concentration of TFB solution was between 6 mg/mL and 10 mg/mL, the spin coating speed was between 3000 rpm and 5000 rpm, and the prepared hole transport layer was conducted with heat treatment at 150° C. in an atmosphere of N$_2$ for 20 mins;

S4: The blue quantum dot (QD) light-emitting layer was prepared by spin coating on the hole transport layer. The QD material was a ZnCdSeS/ZnS QD solution with a concentration of between 10 mg/mL and 30 mg/mL, and the spin coating speed was between 3000 rpm and 5000 rpm; and the blue QD light-emitting layer was performed in an atmosphere of N$_2$ at between 80° C. and 100° C. for 5 mins;

S5: The electron transport layer was prepared by spin coating on the QD light-emitting layer. The electron transport material was a ZnO@Yb$_2$O$_3$ core-shell structure particle prepared in Example 11. The solution concentration was between 20 mg/mL and 40 mg/mL, and the spin coating speed was optionally between 3000 rpm and 5000 rpm; heat treatment was performed at a temperature of between 80° C. and 100° C. for 30 mins; and S6: a second electrode was prepared on the electron transport layer, an optional electrode material was Ag, the thickness was between 80 nm and 100 nm, and the vacuum evaporation process was used to prepare the second electrode, with a plating rate of 1 angstrom per second.

Example 22

This example provides a QLED light-emitting diode and a manufacturing method thereof. The structure and preparation method of the QLED light-emitting diode were same as those of the QLED light-emitting diode in Example 21, except that the material of the electron transport layer was the ZnO@La$_2$O$_3$ core-shell structure particle prepared in Example 12.

Example 23

This example provides a QLED light-emitting diode and a manufacturing method thereof. The structure and preparation method of the QLED light-emitting diode were the same as those of the QLED light-emitting diode in Example 21, except that the material of the electron transport layer was the ZnO@LaTi$_2$O$_7$ core-shell structure particle prepared in Example 13.

Example 24

This example provides a QLED light-emitting diode and a manufacturing method thereof. The structure and preparation method of the QLED light-emitting diode were the same as those of the QLED light-emitting diode in Example 21, except that the material of the electron transport layer was the $ZnO@LaTi_2O_7@La_2O_3$ core-shell structure particle prepared in Example 14.

Example 25

This example provides a QLED light-emitting diode and a manufacturing method thereof. The structure and preparation method of the QLED light-emitting diode are the same as those of the QLED light-emitting diode in Example 21, except that the material of the electron transport layer is the $ZnO@NiO@ZrO_2$ core-shell structure particles prepared in Example 15.

Comparative Example 21

This Comparative Example provides a QLED light-emitting diode and a manufacturing method thereof. The structure and preparation method of the QLED light-emitting diode of this Comparative Example were the same as those of the QLED light-emitting diode in Example 21, except that the material of the electron transport layer was the doped zinc oxide material prepared in Comparative Example 11.

Comparative Example 22

This Comparative Example provides a QLED light-emitting diode and a manufacturing method thereof. The structure and preparation method of the QLED light-emitting diode of this Comparative Example were the same as those of the QLED light-emitting diode in Example 21, except that the material of the electron transport layer was the zinc oxide-containing composition material prepared in Comparative Example 12.

Photoelectric Performance Test of Quantum Dot Light-Emitting Diodes

The QLED devices manufactured in Example 21 to Example 25 and Comparative Example 21 to Comparative Example 22 were tested respectively, and the related optoelectronic performance tests in Table 1 below were carried out respectively. The test results are shown in Table 1:

TABLE 1

| Group | Items | |
| --- | --- | --- |
| | EQE | LT95@1000 nit |
| Example 21 | 18% | 150 hrs |
| Example 22 | 15% | 120 hrs |
| Example 23 | 20% | 200 hrs |
| Example 24 | 12% | 50 hrs |
| Example 25 | 16% | 80 hrs |
| Comparative Example 21 | 8% | 30 hrs |
| Comparative Example 22 | 5% | 20 hrs |

From the test results in the above Table 1, it can be seen that the EQE and LT95@1000 nit tested by Examples 21 to 25 are significantly better than those of Comparative Example 21 and Comparative Example 22, thus illustrating that the composite electron transport materials in the core-shell structures provided by Examples 11 to 15 of the present application, compared with Comparative Example 21 and Comparative Example 22, have obviously improved band gap and conduction band energy level and electrical conductivity, and the defects on the surface of the zinc oxide nanoparticle are passivated, which improves the electron transport and injection ability, and effectively excites the luminous efficiency of quantum dots.

The above descriptions are only preferred embodiments of the present application, and are not intended to limit the present application. Any modifications, equivalent replacements and improvements made within the spirit and principles of the present application shall be included within the protection scope of the present application.

What is claimed is:

1. A composite electron transport material, comprising: a core and a shell covering on the core; wherein
   the core is made of an inorganic electron transport material,
   the shell is made of a material comprising a metal oxide,
   a band gap of the metal oxide is wider than a band gap of the inorganic electron transport material, and
   a doped layer is formed at an interface between the core and the shell.

2. The composite electron transport material according to claim 1, wherein
   the shell comprises at least two shell layers, and the core is sequentially covered by the shell in an order that the core is covered by a first shell layer, the first shell layer is covered by a second shell layer, and
   a band gap gradient of the at least two shell layers increases from the core to an outer surface of the shell.

3. The composite electron transport material according to claim 2, wherein
   the first shell layer is made of a material comprising at least one of $LaTi_2O_7$ and NiO; and/or
   the second shell layer is made of a material comprising at least one of $La_2O_3$ and $ZrO_2$.

4. The composite electron transport material according to claim 3, wherein the shell is a double-layered structure, and the composite electron transport material is at least one of $ZnO@LaTi_2O_7@La_2O_3$, $ZnO@NiO@ZrO_2$, $TiO_2@LaTi_2O_7@La_2O_3$, $TiO_2@NiO@ZrO_2$, wherein, @ represents covering.

5. The composite electron transport material of claim 2, wherein
   the first shell layer has a thickness of between 1 nm and 3 nm; and/or
   the second shell layer has a thickness of between 1 nm and 3 nm.

6. A light-emitting diode, comprising an electron transport layer, wherein the electron transport layer is made of a material comprising the composite electron transport material according to claim 1.

7. The light-emitting diode of claim 6, wherein the light-emitting diode is a QLED and an OLED; and/or the light-emitting diode is a blue light-emitting diode.

8. The composite electron transport material of claim 1, wherein the metal oxide comprises at least one of $Yb_2O_3$, $La_2O_3$, $LaTi_2O_7$, $Nd_2O_3$, $ZrO_2$, and NiO.

9. The composite electron transport material of claim 1, wherein the inorganic electron transport material comprises at least one of ZnO and $TiO_2$.

10. The composite electron transport material according to claim 1,
    wherein the shell has a thickness of between 1 nm and 6 nm; and/or
    the core has a particle size of between 2 nm and 5 nm.

11. A preparation method of a composite electron transport material, comprising the steps of:

respectively providing an inorganic electron transport material particle and a first precursor solution containing a first metal oxide precursor, and preparing the inorganic electron transport material particle into a core dispersion solution; and mixing the core dispersion solution with the first precursor solution and subjecting a resulting first mixed solution to a first heat treatment to enable the first metal oxide precursor to undergo a redox reaction and a first metal oxide shell layer to grow in situ on a surface of the inorganic electron transport material particle whereby obtaining a composite particle;

wherein, a band gap of a first metal oxide in the first metal oxide shell layer is wider than a band gap of the inorganic electron transport material particle;

wherein the preparation method further comprises steps of:

providing a second precursor solution containing a second metal oxide precursor;

preparing the composite particle into a composite particle dispersion solution; and mixing the composite particle dispersion solution with the second precursor solution and subjecting a resulting second mixed solution to a second heat treatment, to enable the second metal oxide precursor to undergo a redox reaction, and a second metal oxide shell to grow in situ on a surface of the composite particle;

wherein, a band gap of a second metal oxide in the second metal oxide shell layer is wider than a band gap of the first metal oxide.

12. The preparation method according to claim 11, wherein a temperature for the first heat treatment is between 20° C. and 80° C.

13. The preparation method according to claim 11, wherein, in the first mixed solution formed by the core dispersion solution and the first precursor solution, a weight ratio of the inorganic electron transport material particle to the first metal oxide precursor is 1:(0.2 to 3).

14. The preparation method according to claim 11, wherein in the first mixed solution formed by the core dispersion solution and the first precursor solution, a first ligand is further added; and a concentration of the first ligand in the first mixed solution is between 0.01 mg/mL and 0.5 mg/mL.

15. The preparation method according to claim 11, wherein the first metal oxide precursor comprises a corresponding metal salt adapted to generate at least one of $Yb_2O_3$, $La_2O_3$, $LaTi_2O_7$, $Nd_2O_3$, $ZrO_2$, and NiO.

16. The preparation method according to claim 11, wherein the first ligand comprises at least one of ethylene glycol, glycerol, ethanolamine, and tetramethylammonium hydroxide.

17. The preparation method according to claim 11, wherein a temperature for the second heat treatment is between 20° C. and 80° C.; and/or in the second mixed solution formed by the composite particle dispersion solution and the second precursor solution, a weight ratio of the composite particle to the second metal oxide precursor is 1:(0.2 to 3); and/or in the second mixed solution formed by the composite particle dispersion solution and the second precursor solution, a second ligand is further added; and a concentration of the second ligand in the second mixed solution is between 0.01 mg/mL and 0.5 mg/mL; and/or the second metal oxide precursor comprises a corresponding metal salt adapted to generate at least one of $La_2O_3$, $ZrO_2$, $Yb_2O_3$, $LaTi_2O_7$, $Nd_2O_3$, and NiO.

18. The preparation method according to claim 11, wherein the second ligand comprises at least one of ethylene glycol, glycerol, ethanolamine, and tetramethylammonium hydroxide.

* * * * *